United States Patent [19]

Zambrano

[11] Patent Number: 5,585,287
[45] Date of Patent: Dec. 17, 1996

[54] METHOD OF FORMING INTEGRATED CURRENT-LIMITER DEVICE FOR POWER MOS TRANSISTORS

[75] Inventor: Raffaele Zambrano, San Giovanni la Punta, Italy

[73] Assignee: Consorzio per la Ricerca sulla Microelecttronica nel Mezzogiorno, Cataria, Italy

[21] Appl. No.: 458,055

[22] Filed: Jun. 1, 1995

Related U.S. Application Data

[62] Division of Ser. No. 40,216, Apr. 1, 1993, Pat. No. 5,422,509.

[30] Foreign Application Priority Data

Apr. 2, 1992 [EP] European Pat. Off. ............ 92830158

[51] Int. Cl.$^6$ ................................... H01L 21/265
[52] U.S. Cl. .................... 437/31; 437/6; 437/28; 437/32; 437/911; 148/DIG. 10; 148/DIG. 11; 148/DIG. 126
[58] Field of Search ............... 257/69, 335, 368, 257/388, 412, 140, 134, 142, 262, 378, 365, 587, 273, 370, 557, 558; 437/6, 31, 32, 28, 911; 148/DIG. 10, DIG. 11, DIG. 126

[56] References Cited

U.S. PATENT DOCUMENTS

| | | | |
|---|---|---|---|
| 4,669,177 | 6/1987 | D'Arrigo et al. | 29/571 |
| 4,705,759 | 11/1987 | Lidow et al. | 437/29 |
| 4,902,640 | 2/1990 | Sachitano et al. | 437/57 |
| 5,204,541 | 4/1993 | Smayling et al. | 257/138 |
| 5,221,850 | 6/1993 | Sakurai | 257/173 |
| 5,422,509 | 6/1995 | Zambrano | 257/378 |

FOREIGN PATENT DOCUMENTS 3821065  1/1989  Germany.

OTHER PUBLICATIONS

Materials Science and Engineering B, vol. B2, No. 1–3, Feb. 1989, J. Middlehoek, "High Energy Implanted Transistor Fabrication".

Neues aus der Technik, No. 3. 15 Aug. 1986, Wurzburg, Deutschland, p. 1, "Lateraler Hochspannumgstransistor".

*Primary Examiner*—George Fourson
*Assistant Examiner*—Long Pham
*Attorney, Agent, or Firm*—Robert Groover; Betty Formby

[57] ABSTRACT

A bipolar control transistor, forming part of an integrated current-limiter device comprises inside an epitaxial layer superimposed over a semiconductor substrate of a first type of conductivity, a base region of a second type of conductivity accessible from a base contact and regions of collector and emitter of the first type of conductivity contained in the base region and accessible from respective collector and emitter contacts. The base region comprises at least one highly-doped deep-body region which contains almost completely said emitter region, a lightly-doped body region which contains the collector region and an intermediate-doped region which co-operates with the first deep-body region to completely contain the emitter region and a surface area of the base region that is included between the regions of collector and emitter. There is also at least one first portion of a layer of polysilicon superimposed and self-aligned with the surface area between the regions of collector and emitter and electrically connected to the collector contact of the bipolar transistor.

20 Claims, 4 Drawing Sheets

METHOD OF FORMING INTEGRATED CURRENT-LIMITER DEVICE FOR POWER MOS TRANSISTORS

This is a divisional of Ser. No. 08/040,216, filed Apr. 01, 1993, now U.S. Pat. No. 5,422,509.

CROSS-REFERENCE TO RELATED APPLICATION

This application claims priority from European App'n 92830158.9, filed Apr. 02, 1992.

BACKGROUND AND SUMMARY OF THE INVENTION

The present invention relates to an integrated current-limiter device for power MOS transistors and a process for the manufacture thereof.

A current limiter for an MOS power transistor can be accomplished through the use of an MOS current-sensing transistor connected in parallel with the power transistor and in series with a sensing resistance. The voltage produced across this resistance drives the base of a bipolar control transistor so as to cause its firing (and thus the limiting of the gate voltage of the sensing and power transistors) when the voltage across the resistance (and thus the current flowing through the sensing and power transistors) exceeds a preset threshold.

A known monolithic integrated embodiment of that current limiter provides for the formation of MOS transistors of the vertical type with the drain coincident with a semiconductor substrate of a first type of conductivity with a superimposed epitaxial layer of the same type of conductivity, but less highly doped, and of a bipolar transistor of the lateral type in a surface area of the epitaxial layer. More precisely, inside the epitaxial layer there is a base region of the second type of conductivity, inside which there are highly-doped regions of emitter and collector of the first type of conductivity.

This integrated embodiment of the current limiter has the drawback that with the lateral bipolar transistor there is associated a vertical bipolar parasitic transistor with base regions and emitter coincident with those of the lateral bipolar transistor and a collector region coincident with the substrate and thus with the drains of the MOS transistors. The maximum operating voltage of the device is thus determined by the breakdown voltage of the vertical bipolar parasitic transistor, rather than by the breakdown voltage of the power MOS transistor. The object of the present invention is thus that of accomplishing an integrated current-limiter device of the type and a corresponding process for its manufacture, wherein the effects of the vertical bipolar parasitic transistor are reduced to a minimum while the conduction of the lateral bipolar transistor is fostered in the presence of a base bias.

According to one of the innovative teachings set forth herein, this object is attained through an integrated current-limiter device for MOS power transistors provided with a bipolar control transistor, comprising a semiconductor substrate of a first type of conductivity, an epitaxial layer of the same type of conductivity superimposed over the substrate and, for the bipolar control transistor, a base region of a second type of conductivity contained in the epitaxial layer and accessible from a base contact and regions of collector and emitter of the first type of conductivity contained in the base region and accessible from respective collector and emitter contacts, wherein the base region comprises at least one highly-doped deep-body region which contains almost completely the emitter region, a lightly-doped body region which contains the collector region and an intermediate-doped region which, together with the first deep-body region, contains the emitter region, and there is at least one first portion of a layer of polysilicon on gate oxide which is superimposed over an area of the base region included between the regions of collector and emitter and is electrically connected to the collector contact.

Other innovative teachings set forth herein provide a process for the manufacture of the current-limiter device, wherein it comprises the formation of field oxide on a lightly-doped epitaxial layer of a first type of conductivity superimposed over a highly-doped substrate of the same type of conductivity, the definition and implantation of at least one highly-doped deep-body region of a second type of conductivity, the definition of active areas of the substrate deprived by selective removal of the field oxide, the growth of a layer of gate oxide, the deposition and doping of a layer of polysilicon, the definition of at least one first portion of the layer of polysilicon, the implantation of lightly-doped body regions of the second type of conductivity, the definition and implantation of an intermediate-doped region of the second type of conductivity self-aligned with the first portion of the layer of polysilicon, the diffusion of the body regions and of the intermediate-doped region, the definition, the implantation and the diffusion of highly-doped regions of collector and emitter of the first type of conductivity of which the first contained inside the body region and the second contained in the deep-body region and the intermediate-doped region, the creation of base, emitter and collector contacts for the base region and the regions of emitter and collector and the electrical connection of the first portion of the layer of polysilicon with the collector contact.

There is thus obtained a lateral bipolar control transistor for a current-limiter device for an MOS power transistor, wherein the emitter region is completely enclosed by the deep-body region and by the intermediate-doped region; it is thus possible to reduce to a minimum the gain of the associated vertical bipolar parasitic transistor. Such gain is further reduced thanks to the alignment between the intermediate-doped region and the first portion of the layer of polysilicon, whose connection to the collector contact determines the reversal of the conductivity of the body region in the proximity of the collector region and thus fosters the conduction of the lateral bipolar transistor, conduction that takes place only in the presence of a direct bias of the base-emitter junction. The reduction of the gain corresponds to the increase in the breakdown voltage of the vertical bipolar parasitic transistor, and thus me maximum voltage at which the device can operate is no longer limited by this parasitic component, but by the breakdown voltage of the power MOS transistor.

BRIEF DESCRIPTION OF THE DRAWING

The present invention will be described with reference to the accompanying drawings, which show important sample embodiments of the invention and which are incorporated in the specification hereof by reference, wherein.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
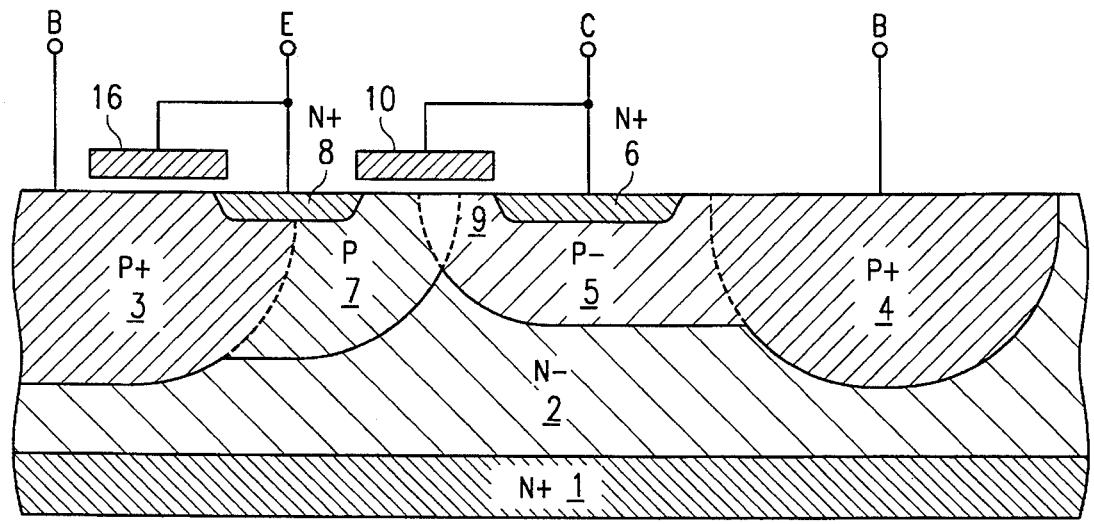
FIG. 1 shows a first integrated structure for a bipolar control transistor for a current-limiter device for a power MOS transistor.
Figure 10:
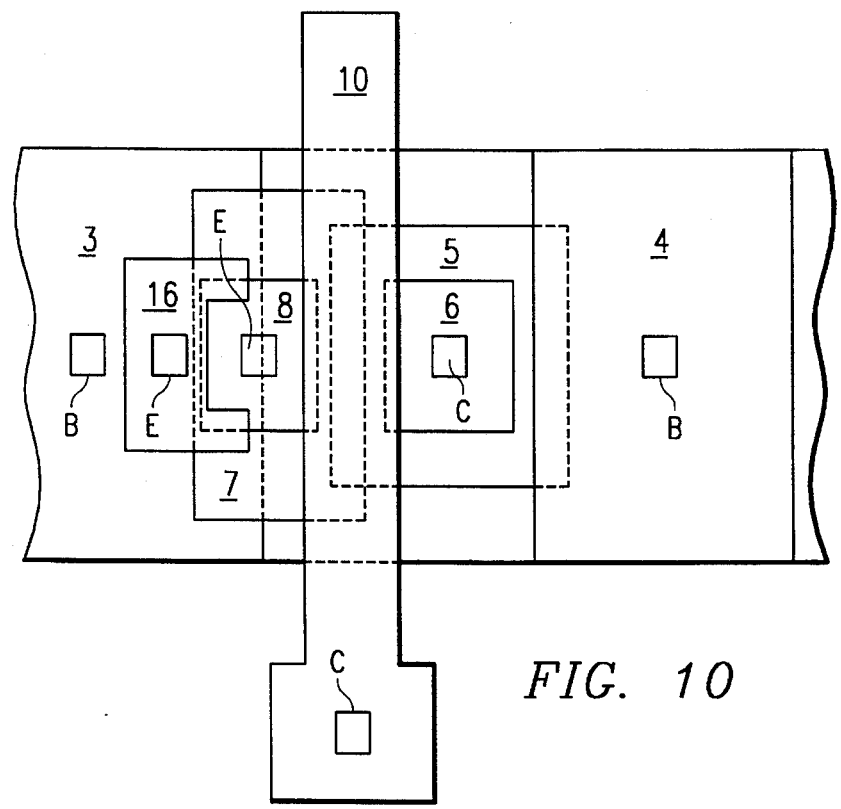
FIG. 10 is a plan view of the structure of FIG. 1.

With reference to FIG. 1, a first integrated structure for a bipolar control transistor for a current-limiter device for a power MOS transistor comprises a semiconductor substrate 1 of the type N+over which there is superimposed an epitaxial layer 2 of the type N−. Inside the epitaxial layer 2 there is a base region, that is formed by a first and a second deep-body region 3, 4 of the type P+, a body region 5 of the type P−that contains a collector region 6 of the type N+, and an intermediate-doped region 7 between the deep-body regions 3, 4 and the body region 5. Such intermediate-doped region 7, together with the first deep-body region 3, completely contains an emitter region 8 of the type N+.

Between the emitter region 8 and that of the collector 6 there is defined a surface area 9, that lies below, with the interposition of gate oxide (not shown), a first portion 10 of a layer of polysilicon, that is connected to the collector contact C connected to the collector region 6. Over the deep-body region 3, again with the interposition of gate oxide, there is superimposed a second portion 16 of the layer of polysilicon, that is connected to an emitter contact E connected to the emitter region 8. There are also base contacts B connected to the deep-body regions 3, 4. Due to its embodiment in the form of an integrated device, the bipolar control transistor is associated with a vertical bipolar parasitic transistor with base and emitter coincident with those of the control transistor and collector coincident with the substrate 1. The fact of enclosing the emitter region 8 inside the unit formed by the deep-body region 3 and by the intermediate-doped region 7 allows the gain of the associated vertical bipolar parasitic transistor to be reduced to a minimum. On the contrary, the presence of the first portion 10 of the layer of polysilicon, whose connection to the collector contact C determines the reversal of the polarity of the surface area 9, fosters the conduction (and thus the gain) of the lateral bipolar transistor should a base bias be present.

The presence of the second portion 16 of the layer of polysilicon, connected to the emitter contact E, contributes to avoiding the reversal of the polarity in the absence of base bias and increases the ruggedness of the device. The deep-body region 4 has the functions of a channel stop and can in turn be used as base contact.

Some specific device parameters, in sample implementation of the embodiment of Figure are as follows. However, it must be understood that these specific values are merely illustrative, and do not delimit the claimed invention at all:

Thickness of oxide under polysilicon plate 10: 50 nm;
Thickness of oxide under polysilicon plate 16: 50 nm;
Thickness of epi layer 2: 10 µm;
Doping of epi layer 2: 4E15 ($4 \times 10^{15}$) cm$^{-3}$ of P;
Junction depth of P+deep-body region 3: 5 µmm;
Doping of P+deep-body region 3:5E18 cm$^{-3}$ (peak) of B;
Junction depth of P+base-contact region 4: 5 µm;
Junction depth of P−body region 5: 3 µm;
Doping of P−body region 5: 5E16 cm$^{-3}$ (peak) of B;
Junction depth of N+collector 6: 0.5 µm;
Junction depth of intermediate-doped region 7: 4 µm;
Doping of region 7: 5E17 cm$^{-3}$ (peak) of B;
Junction depth of N+emitter 8: 0.5 µm.

Figure 2:
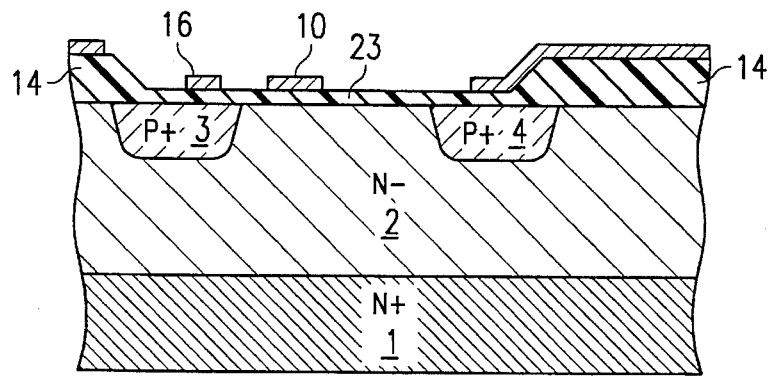
FIGS. 2–7 indicate different steps for the manufacture of the bipolar control transistor of FIG. 1.

FIGS. 2 to 7 illustrate successive steps of a process for the manufacture of the integrated structure of FIG. 1. With reference to FIG. 2, the process provides for the formation of field oxide 14 on an epitaxial layer 2 of the type N−grown on a substrate 1 of the type N+. It then provides for the definition and the implantation of a first and of a second deep-body region 3, 4 of the type P+followed by the definition of active areas of the substrate by means of the selective removal of the field oxide, by the growth of a thin layer of gate oxide 23 and by the deposition and doping of a layer of polysilicon. This is then followed by the definition of a first portion 10 of this layer between the deep-body regions 3, 4, and of a second portion 16 of the same layer of polysilicon on the deep-body region 3.

Figure 3:
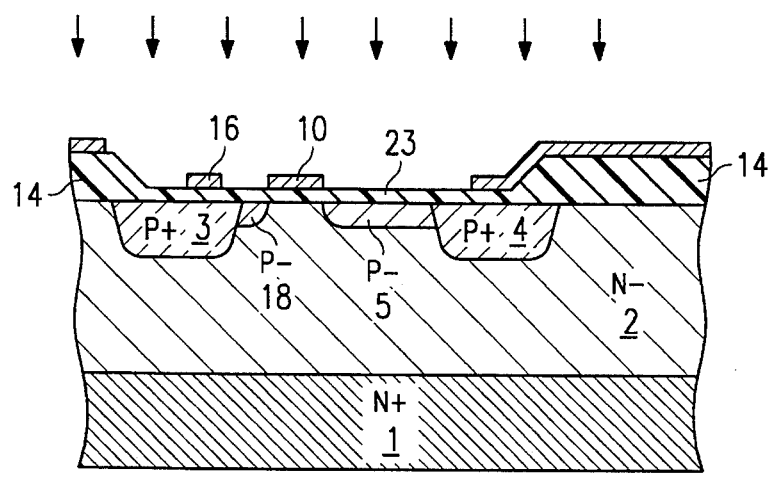
Figure 4:
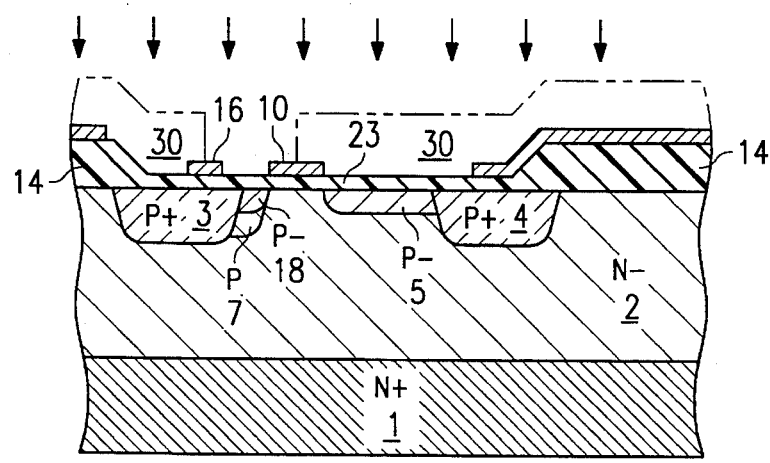
Figure 5:
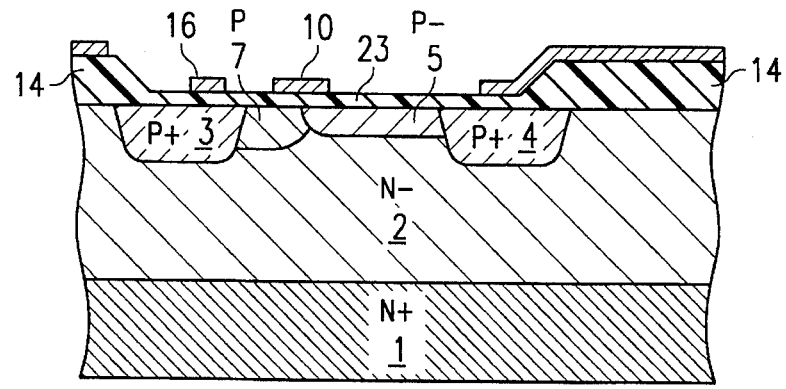
Figure 6:
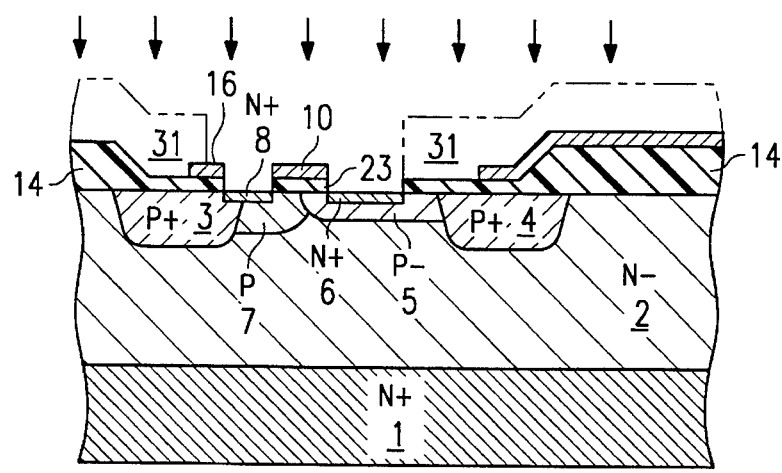
Figure 7:
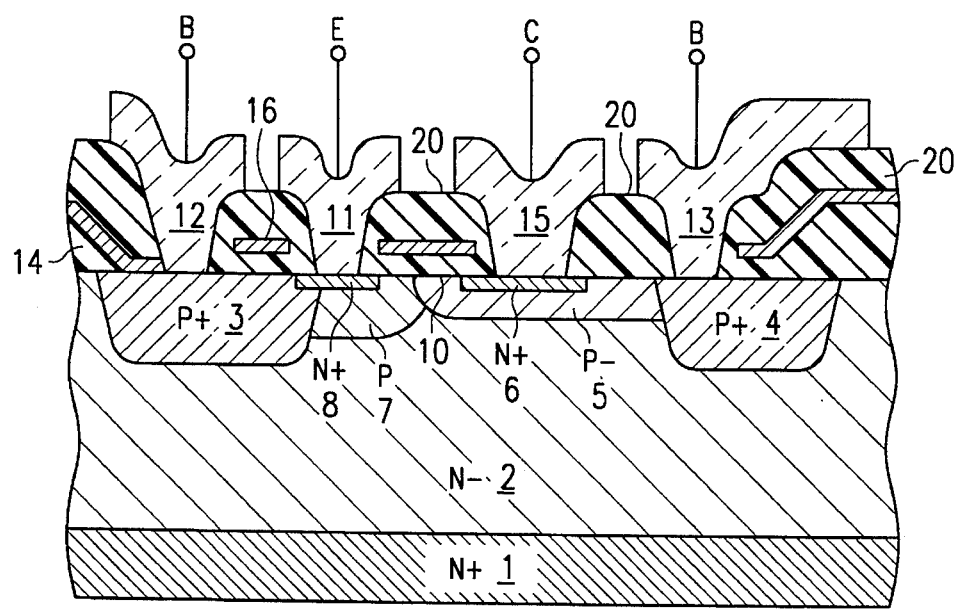

With reference to FIG. 3, the process then provides for the implantation of body regions 5, 18 with B+ions, self-aligned with the portions 10 and 16 of the layer of polysilicon. With reference to FIG. 4, the process also provides for the definition, by means of an appropriate resist 30, and the implantation of an intermediate-doped region 7 of the type P, which is self-aligned with the portion 10 of the layer of polysilicon and is between the deep-body region 3 and the body region 5. With reference to FIG. 5, the process continues with the diffusion of the body regions 5 and 18 and of the region 7. Due to the higher doping, the region 7 diffuses to a greater depth with respect to the region 18 and thus the latter, for reasons of intelligibility, is no longer indicated in FIGS. 5, 6, 7, and in FIGS. 1 and 8. With reference to FIG. 6, the process then provides for the definition, by means of resist 31, and the implantation of regions of collector 6 and of emitter 8 of the type N+. The collector region 6 is contained inside the body region 5, the emitter region 8 is contained in the deep-body region 3 and in the intermediate-doped region 7. With reference to FIG. 7, the process comes to an end with the deposition of oxide 20 and the creation of base contacts 12, 13 for the deep-body regions 3, 4, of emitter contacts 11 for the emitter region 8 and of collector contacts 15 for the collector region 6. 5 Contact areas for the portions 10 and 16 of the layer of polysilicon are not shown in FIG. 7, but are in any case defined in order to allow the connection to the contact areas 15 and 11, respectively.

Figure 8:
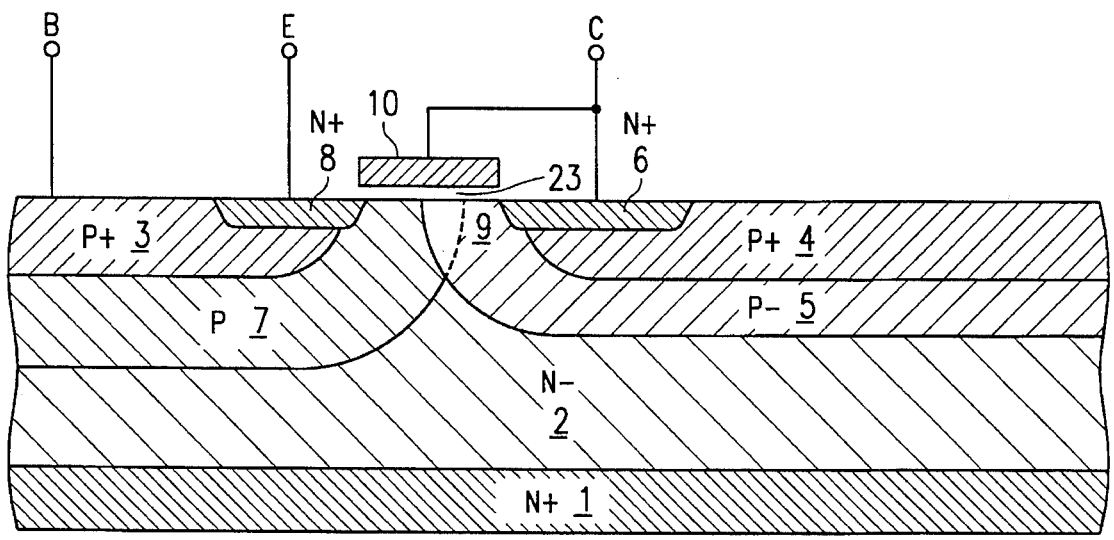
FIG. 8 shows an alternative integrated structure for a bipolar control transistor.
Figure 9:
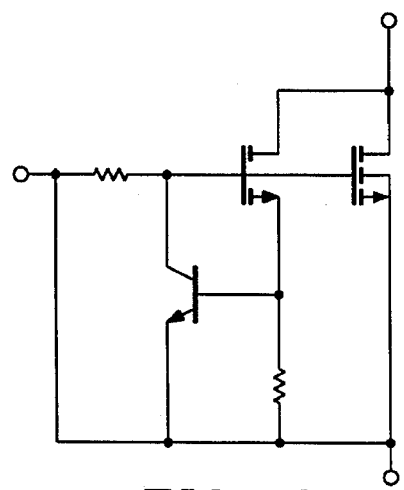
FIG. 9 shows a typical circuit configuration for interconnection of a bipolar control transistor with a power transistor and a sensing transistor.

The operation of the lateral bipolar transistor and that of the device as a whole are not jeopardized by the absence of the second portion 16 of the layer of polysilicon. A second structure alternative to that of FIG. 1 is represented in FIG. 8. It differs from that of FIG. 1 due to the fact that the second portion 16 of the layer of polysilicon is not defined, and the deep-body regions 3 and 4 are self-aligned with the portion 10 of the layer of polysilicon, according to the process described in the European patent application No. 90830462.9 filed on 16 October 1990. In this way the effects of the bipolar parasitic transistor are further reduced. It is also possible to provide for the definition of active areas of the device by means of LOCOS-type processes, according to techniques known to the practitioners of the art, without, on the other hand, going outside the scope of the invention as defined in the following claims.

FURTHER MODIFICATIONS AND VARIATIONS

It will be recognized by those skilled in the art that the movative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples my help to show some of the scope of the inventive concepts, but these examples do not nearly exhaust the full scope of variations in the disclosed novel concepts.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A process for the manufacture of a current-limiter device for MOS power transistors provided with a bipolar control transistor, comprising, for the formation of a bipolar control transistor, the steps of:

the formation of a field oxide on a lightly-doped epitaxial layer of a first type of conductivity grown on a highly-doped substrate of the first type of conductivity, the definition and implantation of a first highly-doped deep-body region of a second type of conductivity, the definition of active areas of the substrate by means of the selective removal of the field oxide, the growth of a layer of gate oxide, the deposition and doping of a layer of polysilicon, the definition of at least one first portion of said layer of polysilicon on one side of said first highly-doped deep-body region, the implantation of lightly-doped body regions of said second type of conductivity, the definition and implantation of an intermediate-doped region of said second type of conductivity between said first highly-doped deep-body region and said lightly-doped body regions self-aligned with said first portion of said layer of polysilicon, the diffusion of the lightly-doped body regions and of said intermediate-doped region, the definition and implantation of first and second highly-doped regions of collector and emitter of the first type of conductivity of which the first highly-doped region is contained inside said lightly-doped body region and the second highly-doped region is included in said first highly-doped deep-body region and said intermediate-doped region, the creation of base, emitter and collector contacts for said first highly-doped deep-body region and said regions of emitter and collector and he electrical connection of said first portion of the layer of polysilicon with said collector contact.

2. The process of claim 1, comprising the definition and implantation of a second highly-doped deep-body region of said second type of conductivity simultaneously with the definition of said first high-doped deep-body region.

3. The process of claim 1, comprising the definition of a second portion of said layer of polysilicon superimposed over said first highly-doped deep-body region and aligned with said emitter region, simultaneously with the definition of said first portion of the layer of polysilicon.

4. The method of claim 1, wherein said first conductivity type is N-type.

5. The method of claim 1 wherein said lightly-doped body regions are shallower than said first highly-doped deep-body region.

6. The method of claim 1, therein said intermediate-doped region is shallower than said first highly-doped deep-body region.

7. A process for the manufacture of a current-limiter device for MOS power transistors provided with a bipolar control transistor, comprising, for the formation of a bipolar control transistor, the steps of:

providing a lightly-doped epitaxial layer of a first type of conductivity grown on a highly-doped substrate of the first type of conductivity;

defining and implanting a first highly-doped deep-body region of a second type of conductivity;

providing a patterned field oxide on said epitaxial layer, said field oxide exposing portions of said epitaxial layer in predetermined active area locations;

forming a gate dielectric, and a patterned conductive gate layer comprising polysilicon thereover; a first portion of said conductive gate layer being formed to one side of said first highly-doped deep-body region;

introducing dopants to form lightly-doped body regions of said second type of conductivity;

introducing dopants to form an intermediate-doped region of said second type of conductivity between said first highly-doped deep-body region and said lightly-doped body regions, said inter- mediate-doped region being self-aligned to said first portion of said conductive gate introducing dopants to form collector and emitter regions of the first conductivity type, said collector region being contained inside said lightly-doped body region and said emitter region being surrounded by said first highly-doped deep-body region and said inter- mediate-doped region;

forming contacts to said emitter and collector regions and said first highly-doped deep-body; and electrically connecting said first portion of said conductive gate layer to said collector contact.

8. The method of claim 7, wherein said lightly-doped body regions are self-aligned to said first portion of said conductive gate.

9. The method of claim 7, wherein said first conductivity type is N+type.

10. The method of claim 7, wherein said lightly-doped body regions are shallower than said first highly-doped deep-body region.

11. The method of claim 7, wherein said intermediate-doped region is shallower than said first highly-doped deep-body region.

12. The method of claim 21, comprising the definition and implantation of a second highly-doped deep-body region of said second type of conductivity simultaneously with the definition of said first highly-doped deep-body region.

13. The method of claim 21, comprising the definition of a second portion of said layer of polysilicon superimposed over said first highly-doped deep-body region and aligned with said emitter region, simultaneously with the definition of said first portion of the layer of polysilicon.

14. A process for the manufacture of a current-limiter device for MOS power transistors provided with a bipolar control transistor, comprising, for the formation of a bipolar control transistor, the steps of:

providing a lightly-doped epitaxial layer of a first type of conductivity grown on a highly-doped substrate of the first type of conductivity;

defining and implanting a first highly-doped deep-body region of a second type of conductivity;

providing a patterned field oxide on said epitaxial layer, said field oxide exposing portions of said epitaxial layer in predetermined active area locations;

forming a gate dielectric, and a patterned conductive gate layer thereover; a first portion of said conductive gate layer being formed to one side of said first highly-doped deep-body region;

introducing dopants to form lightly-doped body regions of said second type of conductivity, which are self-aligned to said first portion of said conductive gate layer, and which are more lightly doped than said first highly-doped deep-body region;

introducing dopants to form an intermediate-doped region of said second type of conductivity between said first highly-doped deep-body region and said lightly-doped body regions, said intermediate-doped region being more heavily doped than said lightly-doped body regions and more lightly doped than said first highly-doped deep-body region;

introducing dopants to form collector and emitter regions of the first conductivity type, said collector region being contained inside said lightly-doped body region and said emitter region being surrounded by said first highly-doped deep-body region and said inter- mediate-doped region;

forming contacts to said emitter and collector regions and said first highly-doped deep-body; and electrically connecting said first portion of said conductive gate layer to said collector contact.

15. The method of claim 14, wherein said intermediate-doped region is self-aligned to said first portion of said conductive gate.

16. The method of claim 14, wherein said first conductivity type is N-type.

17. The method of claim 14, wherein said lightly-doped body regions are shallower than said first highly-doped deep-body region.

18. The method of claim 14, wherein said intermediate-doped region is shallower than said first highly-doped deep-body region.

19. The method of claim 14, comprising the definition and implantation of a second highly-doped deep-body region of said second type of conductivity simultaneously with the definition of said first highly-doped deep-body region.

20. The method of claim 14, comprising the definition of a second portion of said layer of polysilicon superimposed over said first highly-doped deep-body region and aligned with said emitter region, simultaneously with the definition of said first portion of the layer of polysilicon.

* * * * *

UNITED STATES PATENT AND TRADEMARK OFFICE
CERTIFICATE OF CORRECTION

PATENT NO. : 5,585,287
DATED : Dec. 17, 1996
INVENTOR(S) : Zambrano

It is certified that error appears in the above-indentified patent and that said Letters Patent is hereby corrected as shown below:

Title page, item [73], please delete "Cataria" and replace with --Catania--.

Title page, item [73], delete "Microelecttronica" and replace with --Microelettronica--

Signed and Sealed this

Sixteenth Day of December, 1997

Attest:

BRUCE LEHMAN

Attesting Officer

Commissioner of Patents and Trademarks